(12) United States Patent
Adachi et al.

(10) Patent No.: US 9,980,403 B2
(45) Date of Patent: May 22, 2018

(54) CASE WITH CONNECTOR AND METHOD OF MANUFACTURING CASE WITH CONNECTOR

(71) Applicant: Yazaki Corporation, Tokyo (JP)

(72) Inventors: Hideki Adachi, Shizuoka (JP); Minoru Hasegawa, Niigata (JP); Masahito Nakamura, Niigata (JP)

(73) Assignee: YAZAKI CORPORATION, Tokyo (JP)

( * ) Notice: Subject to any disclaimer, the term of this patent is extended or adjusted under 35 U.S.C. 154(b) by 0 days. days.

(21) Appl. No.: 15/448,244

(22) Filed: Mar. 2, 2017

(65) Prior Publication Data

US 2017/0257963 A1    Sep. 7, 2017

(30) Foreign Application Priority Data

Mar. 2, 2016   (JP) .................................. 2016-039672

(51) Int. Cl.
| | |
|---|---|
| *H05K 5/00* | (2006.01) |
| *H05K 5/02* | (2006.01) |
| *B29C 45/14* | (2006.01) |
| *H05K 5/06* | (2006.01) |
| *H05K 13/00* | (2006.01) |
| *B29L 31/36* | (2006.01) |

(52) U.S. Cl.
CPC ..... *H05K 5/0247* (2013.01); *B29C 45/14467* (2013.01); *H05K 5/003* (2013.01); *H05K 5/069* (2013.01); *H05K 13/0023* (2013.01); *B29C 45/14639* (2013.01); *B29L 2031/36* (2013.01); *H05K 2203/1305* (2013.01)

(58) Field of Classification Search
CPC ............ H02G 3/08; H02G 3/081; H02G 5/00; H05K 5/00; H05K 5/0247; H05K 5/003; H05K 5/0069; H05K 13/0023; H05K 2203/1305; H05K 5/069; H05K 5/0204; B29C 45/14467; B29C 45/14639; B29L 2031/36
USPC .......... 174/50, 59, 17 R, 68.1, 520; 439/535, 439/76.1, 76.2, 949
See application file for complete search history.

(56) References Cited

U.S. PATENT DOCUMENTS

| | | | | |
|---|---|---|---|---|
| 6,600,658 | B2 * | 7/2003 | Iwata ..................... | H05K 7/026 174/50 |
| 6,870,096 | B2 * | 3/2005 | Suzuki ............... | B60R 16/0239 174/50 |
| 7,425,677 | B2 * | 9/2008 | Gates ................... | H01R 13/508 174/481 |
| 7,465,172 | B2 * | 12/2008 | Ishiguro ............... | H05K 1/0266 174/50 |
| 8,263,880 | B2 * | 9/2012 | Kraus ................... | H05K 5/064 174/50 |

(Continued)

FOREIGN PATENT DOCUMENTS

JP          9-46858 A     2/1997

*Primary Examiner* — Angel R Estrada
(74) *Attorney, Agent, or Firm* — Kenealy Vaidya LLP

(57) ABSTRACT

A case with connector includes a connector; a case body that has a cylindrical side wall portion and an end wall portion closing one end side of the side wall portion and forming an accommodation portion along with the side wall portion, the case body being formed by insert molding and integrated with the connector at the side wall portion; and an electrical wire that has an end connected to the connector and the other end projecting to the accommodation portion.

3 Claims, 12 Drawing Sheets

(56) References Cited

U.S. PATENT DOCUMENTS

| | | | |
|---|---|---|---|
| 8,269,116 B2 * | 9/2012 | Ambo | H05K 5/0069 |
| | | | 439/76.2 |
| 8,366,457 B2 * | 2/2013 | Yamamoto | H05K 3/4046 |
| | | | 439/76.2 |
| 8,710,366 B2 * | 4/2014 | Rosen | H01R 9/223 |
| | | | 174/50 |
| 8,901,420 B2 * | 12/2014 | Hellwig | H05K 5/0252 |
| | | | 174/50 |

* cited by examiner

CASE WITH CONNECTOR AND METHOD OF MANUFACTURING CASE WITH CONNECTOR

CROSS-REFERENCE TO RELATED APPLICATION(S)

The present application claims priority to and incorporates by reference the entire contents of Japanese Patent Application No. 2016-039672 filed in Japan on Mar. 2, 2016.

BACKGROUND OF THE INVENTION

1. Field of the Invention

The present invention relates to a case with connector and a method of manufacturing the case with connector.

2. Description of the Related Art

Cases having a connector part are conventionally known. For example, Japanese Patent Application Laid-open No. 9-046858 describes a technique relating to a branch connection box configured with a case body including an upper case with a plurality of connector housings integrally molded on a substrate and a lower case attachably and detachably installed to the upper case, crimping terminals supported by and fixed to the upper case, and a sheet wiring member serving as a circuit body accommodated in the case body.

A sheet wiring member of Japanese Patent Application Laid-open No. 9-046858 is configured such that a certain circuit formed of round naked electrical wires is sandwiched by transparent insulation synthetic resin sheets through an adhesive agent. The crimping terminal and the naked electrical wire of the sheet wiring member are electrically connected with each other by pressing the crimping terminal against the naked electrical wire in such a manner that sticks the terminal in the synthetic resin film of the sheet wiring member and has the terminal dig into the electrical wire.

Improving manufacturing efficiency of a case with connector has been requested. For example, assembling a conductive member such as an electrical wire to a connector after integration of the connector and a case may decrease efficiency in the assembly operation.

SUMMARY OF THE INVENTION

It is thus an object of the present invention to provide a case with connector and a method of manufacturing the case with connector capable of improving manufacturing efficiency.

In order to achieve the above mentioned object, a case with connector according to one aspect of the present invention includes a connector; a case body that includes a cylindrical side wall portion and an end wall portion closing one end side of the side wall portion and forming an accommodation portion along with the side wall portion, the case body being formed by insert molding and integrated with the connector at the side wall portion; and a conductive member that has one end side connected to the connector and another end side projecting into the accommodation portion.

According to another aspect of the present invention, in the case with connector, it is preferable that the conductive member projects into an inner portion of the accommodation portion in a depth direction.

According to still another aspect of the present invention, a method of manufacturing a case with connector includes a connector retention process of causing a mold retain a connector, the mold having a hollow portion into which resin is injected and a conductive member accommodation portion partitioned from the hollow portion, and of accommodating a conductive member that is connected to the connector in the conductive member accommodation portion; and a case formation process of forming a case body by integrating the case body with the connector and accommodating the conductive member in an inside room of the case body with insert molding in which resin is injected into the mold.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A case with connector and a method of manufacturing the case with connector according to the present invention will now be described with reference to the drawings. It should be noted that the embodiment is not intended to limit the scope of the invention. Components described in the following embodiment include what the skilled person could easily conceive of and what is substantially equivalent to the component.

Embodiment

Figure 1:
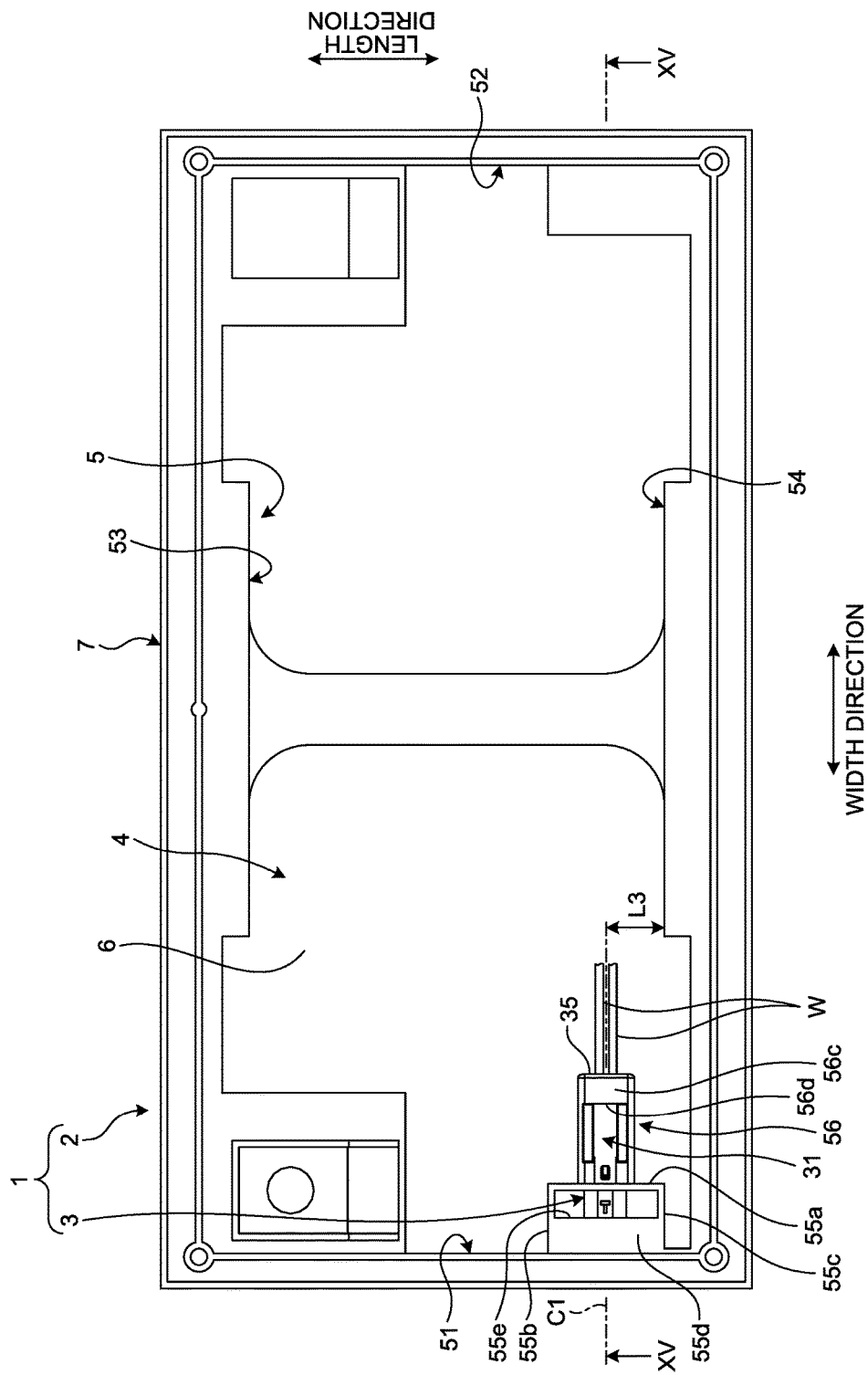
FIG. 1 is a planar view of a case with connector according to an embodiment.
Figure 2:
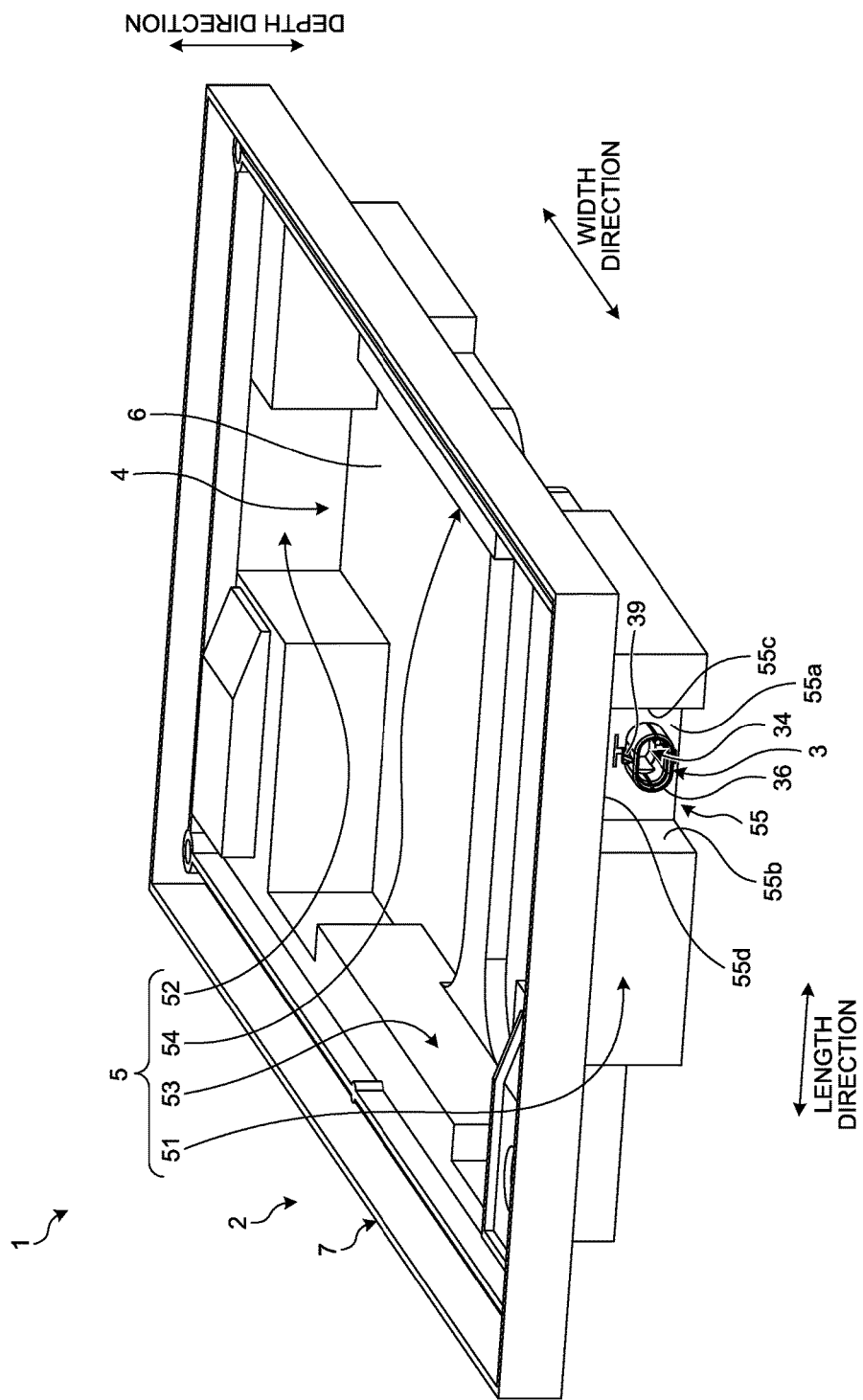
FIG. 2 is a perspective view of the case with connector according to the embodiment.
Figure 3:
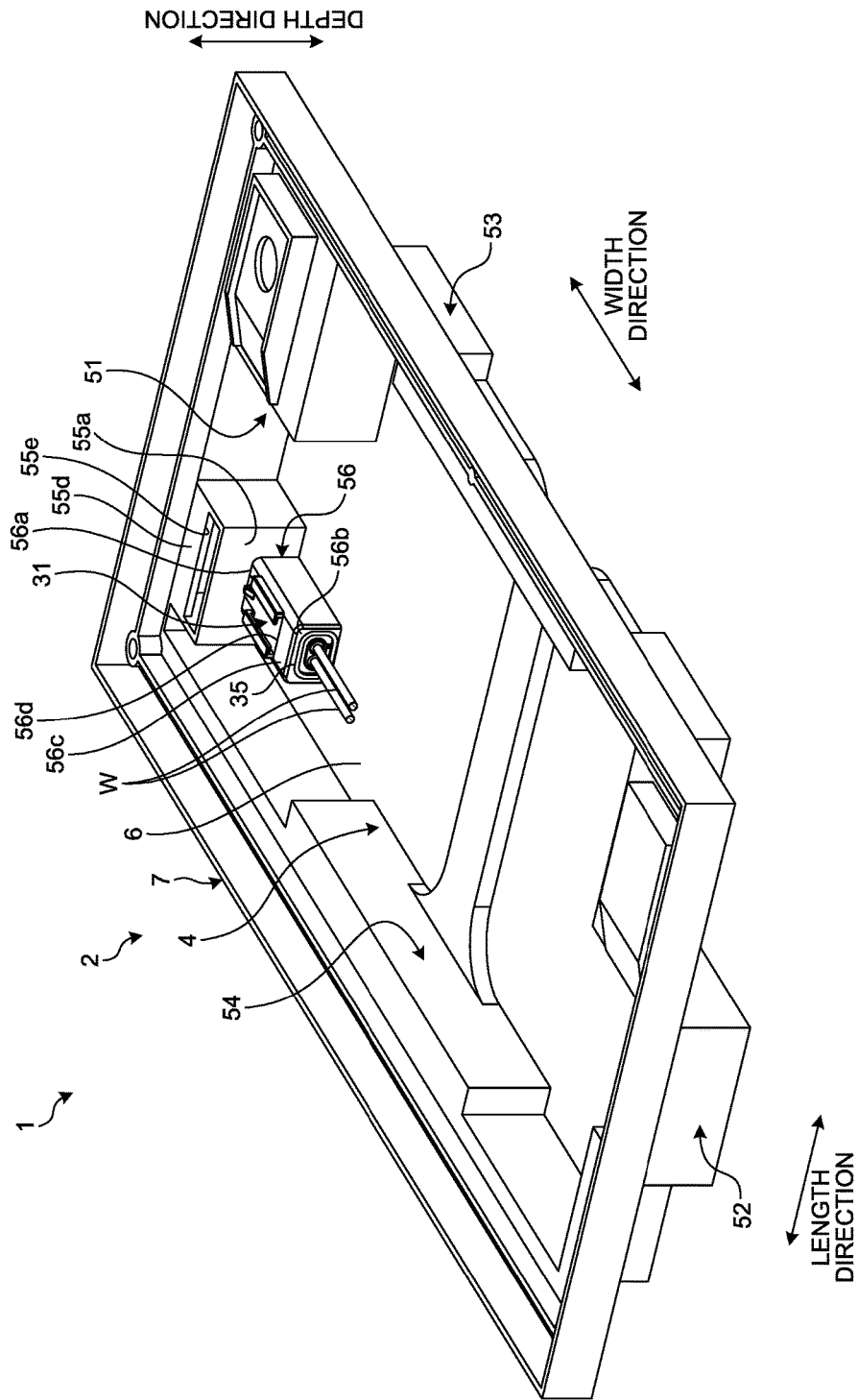
FIG. 3 is another perspective view of the case with connector according to the embodiment.
Figure 4:
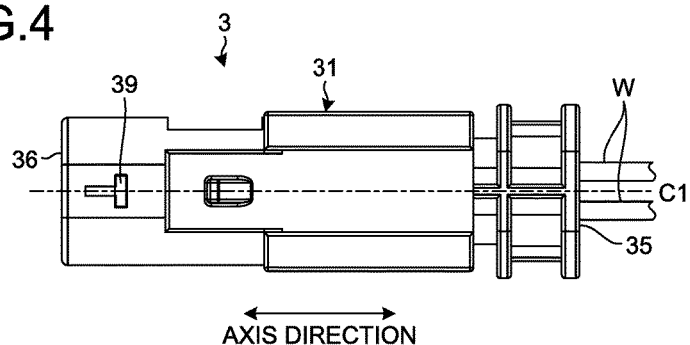
FIG. 4 is a planar view of a connector according to the embodiment.
Figure 5:
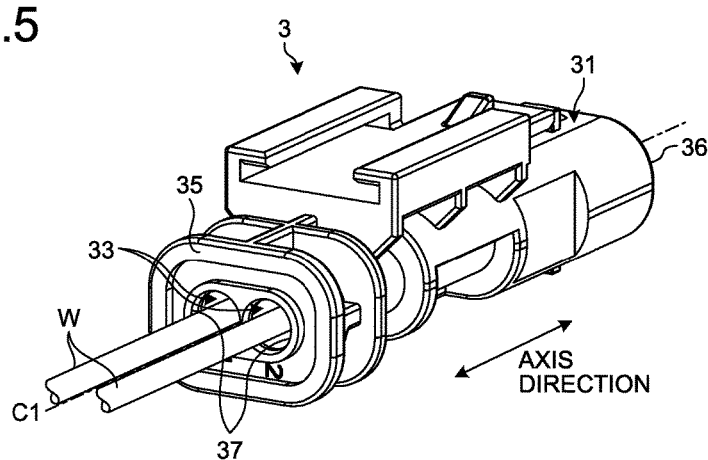
FIG. 5 is a perspective view of the connector according to the embodiment.
Figure 6:
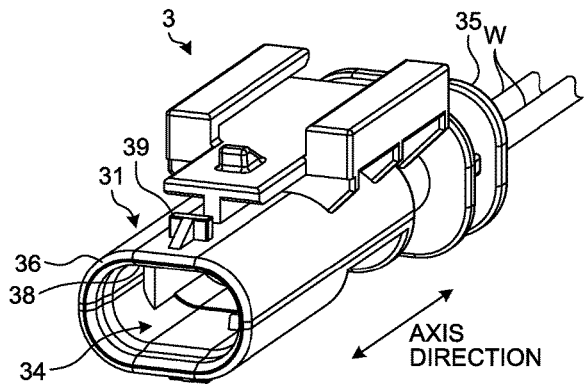
FIG. 6 is another perspective view of the connector according to the embodiment.
Figure 7:
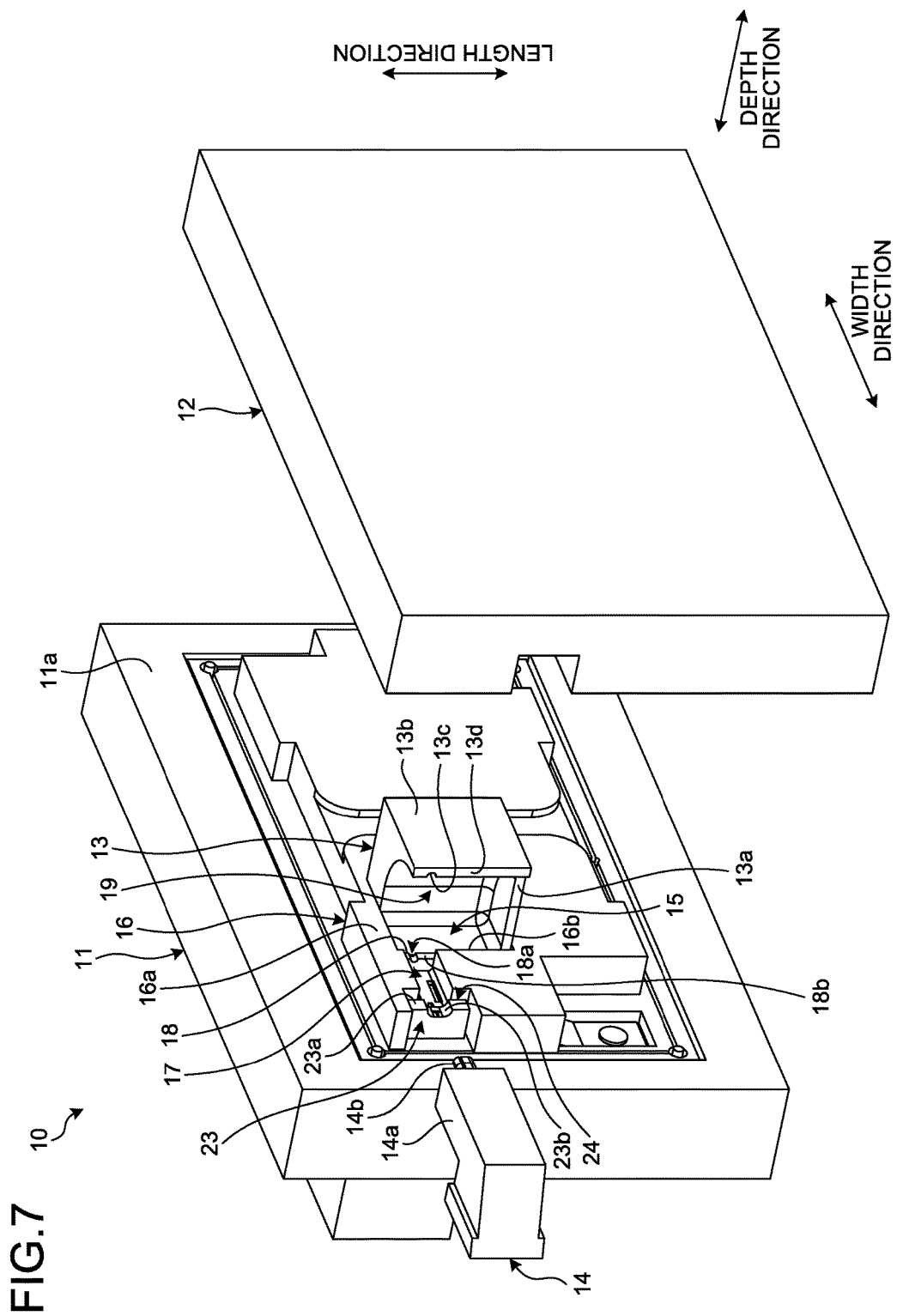
FIG. 7 is an exploded perspective view of a mold according to the embodiment.
Figure 8:
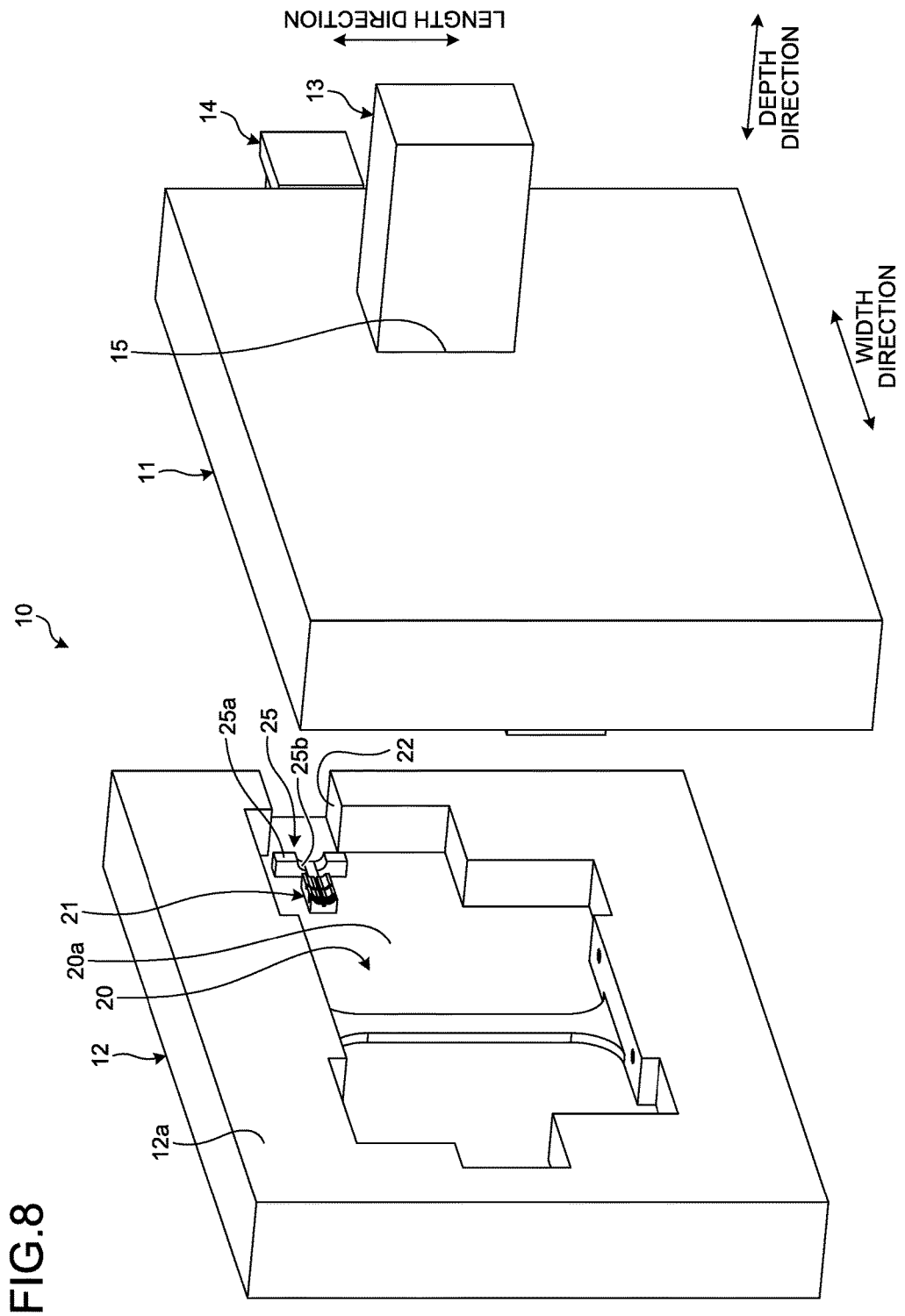
FIG. 8 is another exploded perspective view of the mold according to the embodiment.

An embodiment will now be described with reference to FIGS. 1 to 15. The embodiment relates to a case with connector and a method of manufacturing the case with connector. FIG. 1 is a planar view of the case with connector according to the embodiment. FIG. 2 is a perspective view of the case with connector according to the embodiment. FIG. 3 is another perspective view of the case with connector according to the embodiment. FIG. 4 is a planar view of a connector according to the embodiment. FIG. 5 is a perspective view of the connector according to the embodiment. FIG. 6 is another perspective view of the connector according to the embodiment. FIG. 7 is an exploded perspective view of a mold according to the embodiment. FIG. 8 is another exploded perspective view of the mold according to the embodiment.

As illustrated in FIGS. 1 and 2, a case with connector 1 according to the embodiment includes a case body 2 and a connector 3. The case body 2 has a concave accommodation portion 4 for accommodating electronic parts and others. Examples of the electronic part accommodated in the accommodation portion 4 include a connector, a fuse, a relay, a branch unit, and an electronic control unit. The planar shape of the case with connector 1 according to the embodiment is rectangular when viewed from the opening side. The accommodation portion 4 is in a substantially rectangular parallelepiped shape.

The case body 2 has a side wall portion 5, an end wall portion 6, and a peripheral wall portion 7. The side wall portion 5 is a wall portion laterally surrounding the accommodation portion 4. The end wall portion 6 is integrally molded with the side wall portion 5 and closes one end of the side wall portion 5. The end wall portion 6 forms the concave accommodation portion 4 along with the side wall portion 5. The end wall portion 6 can configure a bottom surface of the case body 2 when the case with connector 1 is closed by a cover as a single case for accommodating an electronic part. Furthermore, when the case with connector 1 is assembled to another device, the end wall portion 6 can configure an outer wall portion totally covering the device. When the case with connector 1 is assembled to a battery, the end wall portion 6 can serve as a covering portion covering a terminal and the like of the battery.

The side wall portion 5 according to the embodiment has a first wall portion 51, a second wall portion 52, a third wall portion 53, and a fourth wall portion 54. The first wall portion 51 and the second wall portion 52 are wall portions extending along a length direction. The first wall portion 51 and the second wall portion 52 face each other in a width direction with the accommodation portion 4 interposed therebetween. In the case with connector 1, the "width direction" is a direction along a center axis C1 of the connector 3 and a direction of a side (in this embodiment, a long side) of the rectangle as a planar shape of the case body 2. The "length direction" is a direction perpendicular to the width direction on the rectangle as the planar shape of the case body 2, which is, in this embodiment, a direction of the short side of the rectangle. A "depth direction" is a direction of the depth of the accommodation portion 4 in the case body 2 and a direction perpendicular to each of the length direction and the width direction. The third wall portion 53 and the fourth wall portion 54 are wall portions extending along the width direction. The third wall portion 53 and the fourth wall portion 54 face each other in the length direction with the accommodation portion 4 interposed therebetween.

The peripheral wall portion 7 is formed at an end in the opening side of the case body 2. The peripheral wall portion 7 protrudes outward with respect to the side wall portion 5 in a manner surrounding the side wall portion 5. The peripheral wall portion 7 configures a double-walled waterproof structure along with the side wall portion 5 for preventing inflow of water into the accommodation portion 4.

The connector 3 illustrated in FIGS. 4 to 6 configures the case with connector 1 in a manner integrated with the side wall portion 5. The connector 3 is formed, for example, of resin and has a housing 31. The housing 31 is a cylindrical hollow member with its cross-sectional surface formed in a substantially ellipsoidal shape. The connector 3 further has a terminal disposed inside the housing 31, a retaining mechanism for retaining an electrical wire W in a state contacting with the terminal, and others. The housing 31 has hole portions 33 (see FIG. 5) from which the electrical wires W extend and a fitting portion 34 (see FIG. 6) fitting with a counterpart connector. The hole portion 33 extends from a first opening 37 provided to an end surface (hereinafter referred to as a "first end surface") 35 toward the other end surface (hereinafter referred to as a "second end surface") 36 of the housing 31 in the axis direction of the housing 31. The electrical wire W is inserted into the hole portion 33 and has an end retained by the retaining mechanism in the back portion of the hole portion 33. The electrical wire W axially projects from the first opening 37 toward the outside of the housing 31. The housing 31 in this embodiment has two hole portions 33 arranged in parallel, and two electrical wires W extend from the respective hole portions 33.

As illustrated in FIG. 6, the fitting portion 34 in this embodiment is a concave portion into which a fitting counterpart connector is inserted. The fitting portion 34 extends from a second opening 38 provided to the second end surface 36 toward the first end surface 35 of the housing 31 along the axis direction of the housing 31. An engagement projection 39 is provided to the outer surface of the housing 31. The engagement projection 39 engages with an engagement portion such as an engagement claw provided to the fitting counterpart connector.

As illustrated in FIGS. 1 and 2, the connector 3 is integrated with the first wall portion 51 of the case body 2. The first wall portion 51 has a concave portion 55 concave toward the inside of the case body 2. The concave portion 55 has a bottom wall portion 55a formed closer to the accommodation portion 4 with respect to the peripheral portion on the first wall portion 51 and connection wall portions 55b, 55c, and 55d. The connection wall portions 55b, 55c, and 55d connect respective portions surrounding the bottom wall portion 55a on the first wall portion 51 with the bottom wall portion 55a. The connection wall portions 55b and 55c face each other in the length direction. The connection wall portion 55d is a wall portion parallel to the end wall portion 6 and connects a pair of connection wall portions 55b and 55c with each other in the length direction. As illustrated in FIG. 1, the connection wall portion 55d has a rectangular through-hole 55e through which the inside and the outside of the case body 2 communicate with each other.

The connector 3 penetrates through the bottom wall portion 55a of the concave portion 55 and is integrated with the bottom wall portion 55a. As illustrated in FIG. 2, an end in the second end surface 36 side of the connector 3 is externally exposed from the bottom wall portion 55a. More specifically, the housing 31 has a portion including at least the engagement projection 39 in the second end surface 36 side, and the portion externally projects from the bottom wall portion 55a. In other words, the side wall portion 5 is integrated with the connector 3 in a state that a front end portion of the connector 3 that fits with a counterpart connector is externally exposed.

As illustrated in FIG. 1, the first wall portion 51 of the case body 2 has a box-shape retaining portion 56 for retaining the housing 31 of the connector 3. The retaining portion 56 retains the connector 3 in a manner integrated with a part of the outer peripheral surface of the housing 31. The retaining portion 56 is integrally formed with the bottom wall portion 55a and the end wall portion 6. The retaining portion 56 is a structural portion in a hollow rectangular column shape. A first end 56a of the retaining portion 56 in the longitudinal direction is connected with the bottom wall portion 55a. As illustrated in FIG. 3, the first end surface 35 is exposed from the other end surface 56b of the retaining portion 56. The housing 31 penetrates through the other end surface 56b and is integrated with the other end surface 56b. A side surface 56c of the retaining portion 56 has an opening 56d. The housing 31 is integrated with the side surface 56c and closes the opening 56d.

Referring to FIGS. 7 to 13, a mold 10 used in manufacturing the case with connector 1 of this embodiment and a method of manufacturing the case with connector 1 will now be described. In the case with connector 1 according to the embodiment, the case body 2 is integrated with the connector 3 with the electrical wire W preliminarily connected thereto by insert molding. Resin is injected into the mold 10 retaining the connector 3 and the electrical wire W inside thereof. The resin injected into the mold 10 solidifies and is integrated with the connector 3, thereby configuring the case body 2.

Mold

As illustrated in FIG. 7, the mold 10 has a first mold 11, a second mold 12, a third mold 13, and a fourth mold 14. In describing the molds 11, 12, 13, and 14, a length direction, a width direction, and a depth direction correspond to, respectively, the length direction, the width direction, and the depth direction of the case with connector 1 manufactured by using the mold 10.

In this embodiment, the first mold 11 is a mold in the fixed side. The first mold 11 corresponds to the inner surface of the case body 2. The second mold 12 is a mold in the movable side. The second mold 12 corresponds to the outer surface of the case body 2. The third mold 13 is a slide mold. The third mold 13 is disposed in a through-hole 15 of the first mold 11 and is relatively slidable with respect to the first mold 11 in the depth direction. The fourth mold 14 is another slide mold. The fourth mold 14 relatively slides with respect to the first mold 11 in the width direction and closes the fitting portion 34 of the connector 3.

The first mold 11 has a contact surface 11a contacting with the second mold 12. The first mold 11 has a convex portion 16 corresponding to the accommodation portion 4. A front end surface 16a of the convex portion 16 forms the inner surface, that is, a surface in the accommodation portion 4 side, of the end wall portion 6 of the case body 2. The front end surface 16a projects further than the contact surface 11a. The through-hole 15 is formed in the first mold 11. The through-hole 15 penetrates through the first mold 11 in the depth direction. The through-hole 15 in this embodiment has a rectangular cross-sectional surface. The front end surface 16a of the convex portion 16 has an opening 16b. The opening 16b is an end in the front end surface 16a side of the through-hole 15.

The third mold 13 is a rod-shaped or column-shaped member and is slidably supported by the through-hole 15. The third mold 13 in this embodiment is formed in a rectangular prism having a rectangular cross-sectional surface. The first mold 11 has a first retaining portion 17 for retaining the connector 3. The first retaining portion 17 is a concave portion provided to the front end surface 16a of the convex portion 16 and is in a shape corresponding to the housing 31 of the connector 3.

The first mold 11 further has an end retaining portion 23. The end retaining portion 23 is disposed closer to a side opposite to the third mold 13 side with respect to the first retaining portion 17. The end retaining portion 23 is disposed near the first retaining portion 17 and projects toward the same direction as the direction toward which the convex portion 16 projects. The end retaining portion 23 is a plate-like portion with its front end surface 23a positioned a step lower than the front end surface 16a of the convex portion 16. The front end surface 23a has a concave portion 23b for retaining the housing 31. The end retaining portion 23 retains an end on the fitting portion 34 side of the housing 31. A groove portion 24 is formed between the end retaining portion 23 and the first retaining portion 17. Resin injected into the groove portion 24 is integrated with the connector 3 and forms the bottom wall portion 55a.

The first mold 11 has a partition wall 18 for partitioning the first retaining portion 17 and the through-hole 15. A front end surface 18b of the partition wall 18 is positioned a step lower than the front end surface 16a. The partition wall 18 has a notch portion 18a through which the first retaining portion 17 and the through-hole 15 communicate with each other. The notch portion 18a has a certain depth from the front end surface 18b and has a width at least capable of inserting the electrical wire W therein.

As illustrated in FIG. 7, the third mold 13 has an electrical wire accommodation portion 19. The electrical wire accommodation portion 19 is a concave portion formed on a first side surface 13a of the third mold 13. The first side surface 13a is a side surface in the first retaining portion 17 side of the third mold 13. The electrical wire accommodation portion 19 is provided near a front end surface 13b. The front end surface 13b corresponds to a surface on the front end side when the third mold 13 is projected from the front end surface 16a. More specifically, the front end surface 13b is a surface facing the second mold 12 in the depth direction when the first mold 11 and the second mold 12 are joined together. In the third mold 13, a concave portion 13c corresponding to the electrical wire W is provided on a wall surface surrounding the electrical wire accommodation portion 19. The concave portion 13c is formed in the wall surface on the front end surface 13b side. A contact portion 13d protruding from the first side surface 13a in the width direction is provided in the front end of the third mold 13. The contact portion 13d faces the front end surface 18b of the partition wall 18 in the depth direction. The contact portion 13d contacts with the front end surface 18b of the partition wall 18 and configures a partition wall partitioning the connector 3 and the electrical wire accommodation portion 19 from each other. The concave portion 13c is formed at least on the contact portion 13d and retains the electrical wire W along with the notch portion 18a.

As illustrated in FIG. 8, the second mold 12 has a concave portion 20 corresponding to the outer surface of the case body 2. The concave portion 20 is formed on a contact surface 12a of the second mold 12. The contact surface 12a is a surface contacting with the contact surface 11a of the first mold 11. A bottom surface 20a of the concave portion 20 forms an outer surface of the end wall portion 6. The second mold 12 has a second retaining portion 21 for retaining the connector 3. The second retaining portion 21 is a base-like convex portion formed on the bottom surface 20a of the concave portion 20 and is in a shape corresponding to the housing 31 of the connector 3. When the first mold 11 and the second mold 12 are joined together, the second retaining portion 21 retains the housing 31 in a manner sandwiching the housing 31 between the second retaining portion 21 and the first retaining portion 17.

The second mold 12 further has an end retaining portion 25. The end retaining portion 25 is arranged at a position corresponding to the end retaining portion 23 of the first mold 11. The end retaining portion 25 is disposed near the second retaining portion 21 and projects toward the same direction as the direction toward which the second retaining portion 21 projects. The end retaining portion 25 is a plate-like portion, and a concave portion 25b for retaining the housing 31 is formed on a front end surface 25a of the end retaining portion 25. The end retaining portion 25 and the end retaining portion 23 of the first mold 11 together retain an end on the fitting portion 34 side of the housing 31 in a manner sandwiching the end therebetween. When the first mold 11 and the second mold 12 are joined together, the front end surface 23a of the end retaining portion 23 contacts with the front end surface 25a of the end retaining portion 25. With this configuration, the end retaining portions 23 and 25 form a continuous wall portion and partition the first end surface 35 side and the second end surface 36 side of the housing 31 from each other.

The fourth mold 14 as illustrated in FIG. 7 and others has a body 14a and an insertion portion 14b. The body 14a is a prism portion having a rectangular cross-sectional surface. The insertion portion 14b projects from a front end of the body 14a and is inserted in the fitting portion 34 of the connector 3. The length of the insertion portion 14b is smaller than the depth of the fitting portion 34. When the insertion portion 14b is inserted in the fitting portion 34, the front end surface of the body 14a contacts with the second end surface 36 of the connector 3 and closes the second opening 38 of the fitting portion 34. The front end surface of the body 14a contacts with the end retaining portions 23 and 25 and forms the concave portion 55 along with the end retaining portions 23 and 25. As illustrated in FIG. 8, the second mold 12 has a notch portion 22 through which the concave portion 20 communicates with the outside. The cross-sectional surface of the notch portion 22 corresponds to the cross-sectional surface of the body 14a of the fourth mold 14. When the body 14a of the fourth mold 14 is inserted in the notch portion 22 of the second mold 12, gaps corresponding to the connection wall portions 55b, 55c, and 55d are formed between the notch portion 22 and the body 14a.

Method of Manufacturing a Case with Connector

Figure 9:
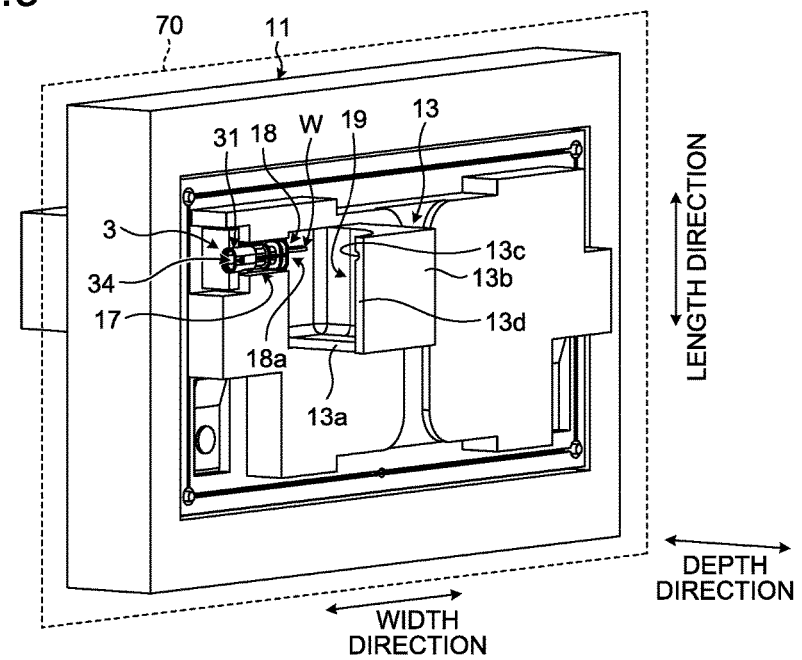
FIG. 9 is a perspective view of the connector and an electrical wire set in a first mold.

A method of manufacturing the case with connector 1 will now be described. Specifically, a method of manufacturing the case with connector 1 using an injection molding machine will be described with reference to the drawings. FIG. 9 is a perspective view of the connector and an electrical wire set in the first mold. The first mold 11 is preliminarily retained by an injection molding machine 70, and an electrical wire assembly process of assembling the electrical wire W to the connector 3 is already completed by, for example, operators.

The connector 3 with the electrical wire W connected thereto is fit in the first retaining portion 17 in such a manner that an end from which the electrical wire W projecting faces the partition wall 18. In this embodiment, the connector 3 is fit in the first retaining portion 17 in such a manner that the first end surface 35 (see FIG. 5) of the housing 31 contacts with the partition wall 18. An end on the fitting portion 34 side of the housing 31 is set in the concave portion 23b of the end retaining portion 23. The electrical wire W is inserted in the notch portion 18a of the partition wall 18 and projects from the partition wall 18 to the side opposite to the housing 31. When the connector 3 is set in the first mold 11, the sliding position of the third mold 13 is arranged to a position where the electrical wire accommodation portion 19 faces the partition wall 18 as illustrated in FIG. 9. The electrical wire W thus projects from the partition wall 18 to the electrical wire accommodation portion 19 and is accommodated in the electrical wire accommodation portion 19. The electrical wire W is preferably collected, for example, wound in a coil so that the electrical wire W can be easily accommodated in the electrical wire accommodation portion 19. A connector retention process of having the first mold 11 retain the connector 3 and the electrical wire W is performed by, for example, operators.

Figure 10:
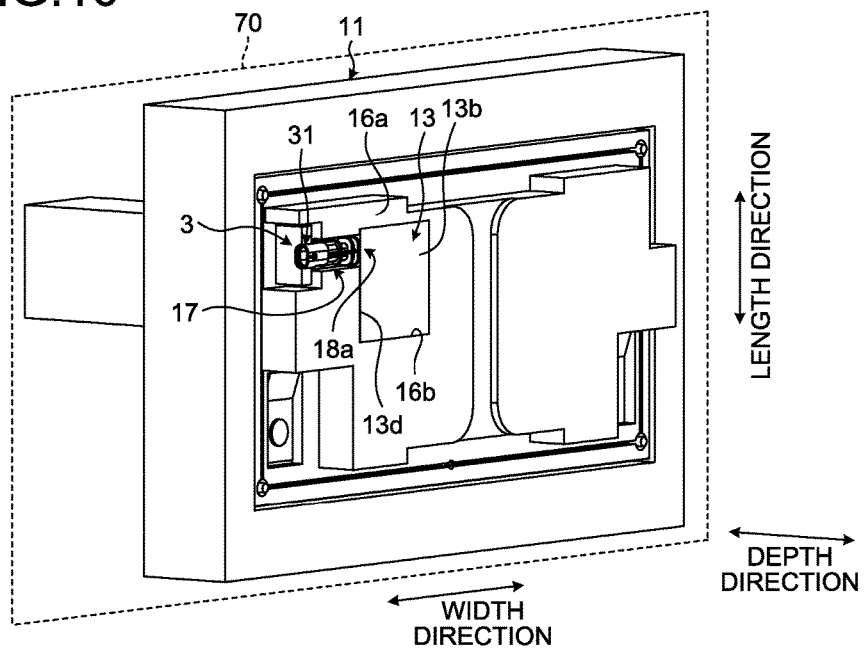
FIG. 10 is a perspective view of a third mold closing an opening.

FIG. 10 is a perspective view of the third mold closing an opening. When the connector 3 and the electrical wire W are set in the first mold 11, the third mold 13 closes the opening 16b of the first mold 11. The third mold 13 slides with respect to the first mold 11 in the depth direction and causes the front end surface 13b to close the opening 16b, that is, an end on the front end surface 16a side of the through-hole 15. In this process, the contact portion 13d of the third mold 13 contacts with the partition wall 18 of the first mold 11 and partitions the first end surface 35 of the connector 3 and the electrical wire accommodation portion 19. The electrical wire W is retained between the notch portion 18a of the partition wall 18 and the concave portion 13c of the third mold 13. The third mold 13 is stopped at a position where the front end surface 13b and the front end surface 16a of the convex portion 16 form a continuous surface. The front end surface 13b closes the opening 16b of the front end surface 16a and configures a planar surface corresponding to the inner surface of the end wall portion 6 along with the front end surface 16a. The front end surface 13b closes the opening 16b and prevents inflow of the resin into the electrical wire accommodation portion 19. A closing process of closing the opening 16b using the front end surface 13b by sliding the third mold 13 is performed, for example, by operators.

Figure 11:
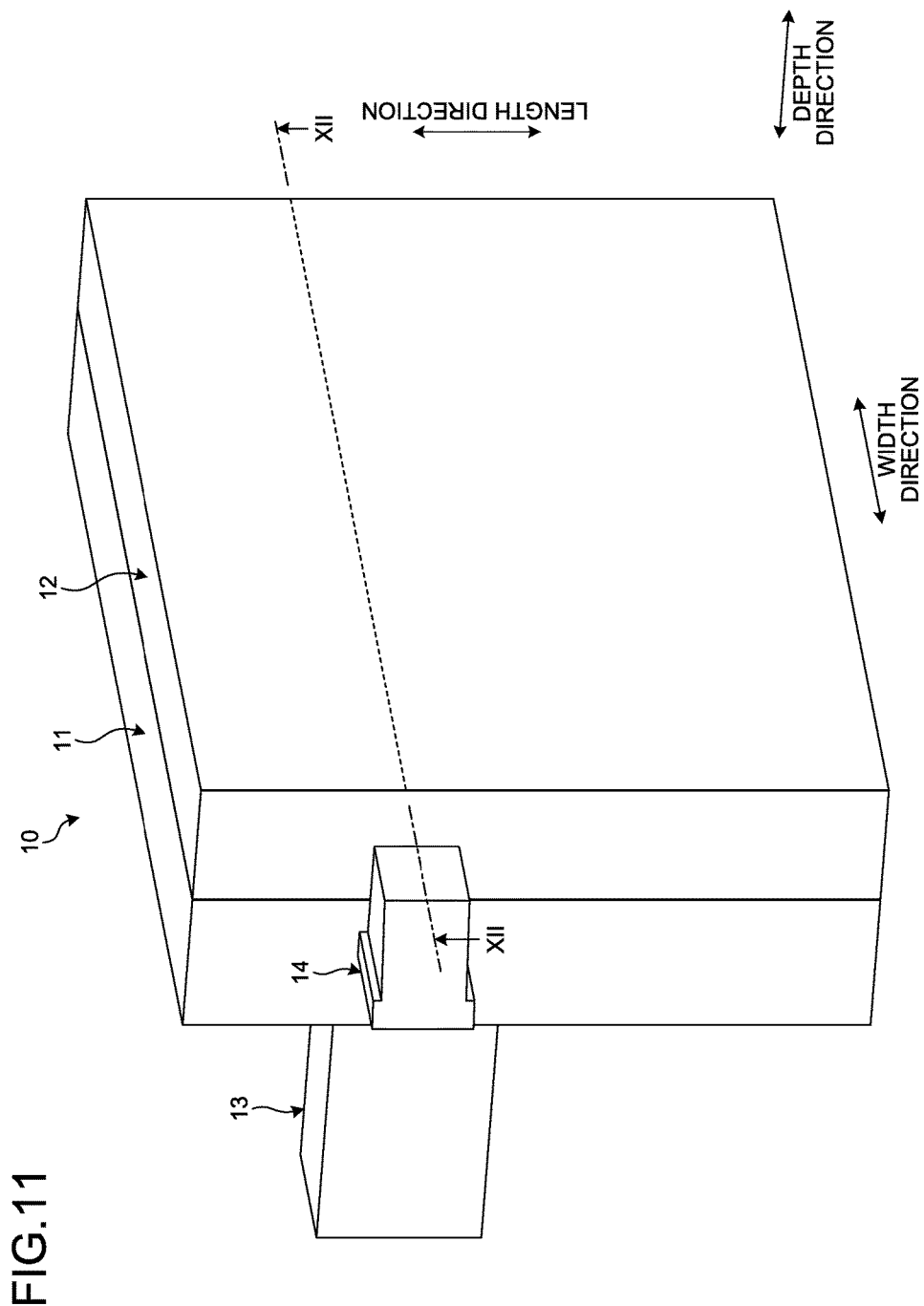
FIG. 11 is a perspective view of the mold in a closed state.

After the closing process, a mold closing process is performed. The mold closing process is a process of joining the second mold 12 and the fourth mold 14 to the first mold 11 and closing the mold 10. The mold 10 after the mold closing process is illustrated in FIG. 11. The mold closing process is performed by the injection molding machine 70. The second mold 12 and the fourth mold 14 are preliminarily retained by the injection molding machine 70. An actuator of the injection molding machine 70 relatively slides the second mold 12 with respect to the first mold 11 in the depth direction. The actuator causes the contact surface 12a of the second mold 12 to contact with the contact surface 11a of the first mold 11. In this process, the convex portion 16 of the first mold 11 is inserted in the concave portion 20 of the second mold 12, which forms a cavity (a hollow portion) for the case body 2. The actuator of the injection molding machine 70 relatively slides the fourth mold 14 with respect to the first mold 11 in the width direction. The actuator has the insertion portion 14b inserted in the fitting portion 34 of the connector 3 and has the body 14a contact with the end retaining portions 23 and 25.

Figure 12:
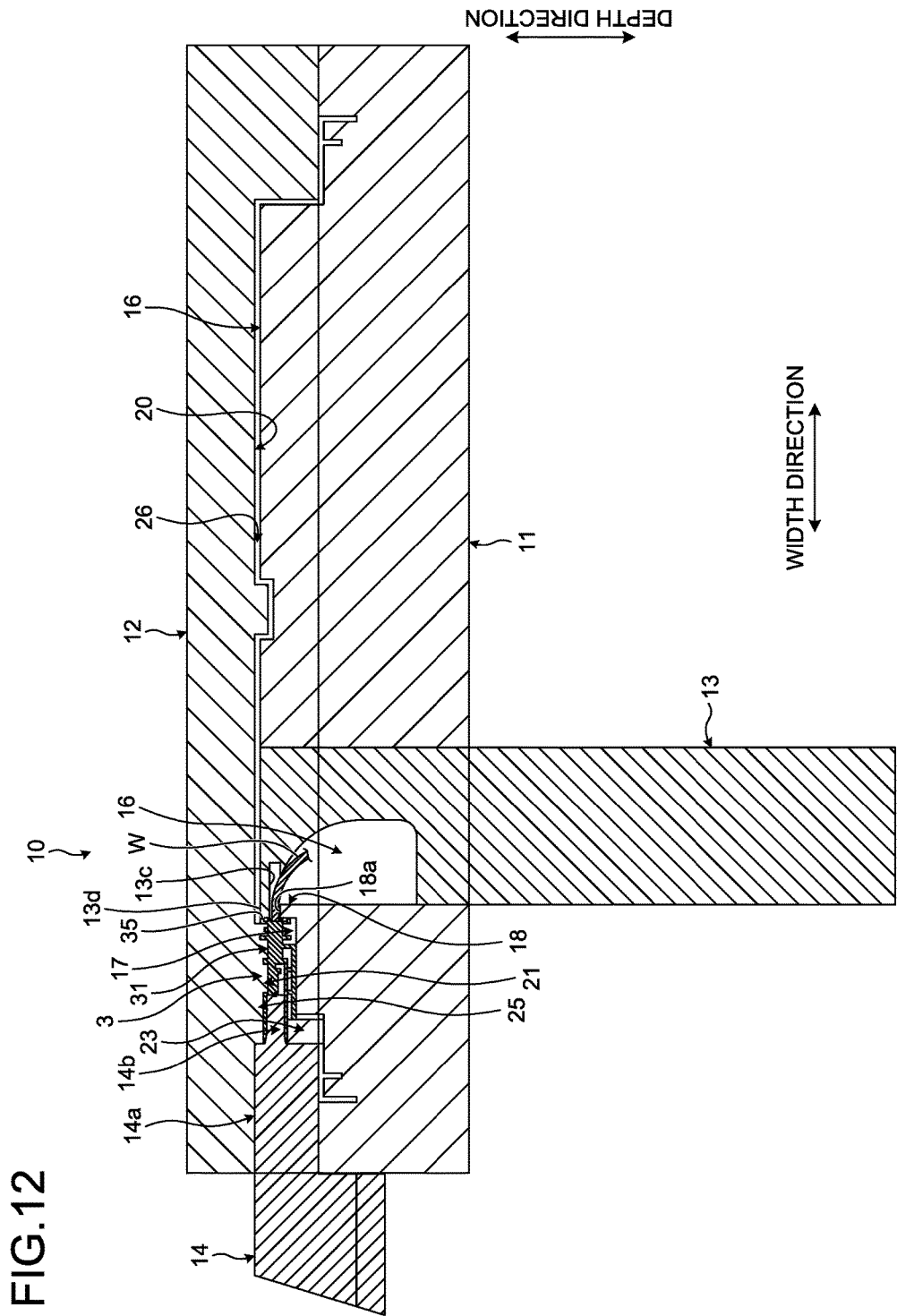
FIG. 12 is a cross-sectional view of the mold in a closed state.

FIG. 11 is a perspective view of the mold in a closed state, and FIG. 12 is a cross-sectional view along the XII-XII line of FIG. 11 and is a cross-sectional view of the mold in a closed state. As illustrated in FIG. 12, a hollow portion 26 is formed between the first mold 11 and the second mold 12. The first end surface 35 of the connector 3 contacts with the contact portion 13d of the third mold 13 or faces the contact portion 13d with a small space interposed therebetween. The electrical wire W closes the notch portion 18a and the concave portion 13c and prevents the resin from flowing into the electrical wire accommodation portion 19 from the hollow portion 26. When the mold 10 is closed, the injection molding machine 70 injects molten resin into the hollow portion 26 of the mold 10. The resin injected into the mold 10 solidifies by being cooled and the like, thereby forming the case body 2 integrated with the connector 3.

In the case with connector 1 of this embodiment, the housing 31 of the connector 3 and the case body 2 are formed of resin made from the same material. When the resin is injected into the hollow portion 26 of the mold 10, the surface portion of the housing 31 contacting with resin is melted and integrated with the resin and solidifies. This process makes the housing 31 and the case body 2 to adhere to each other, and the connector 3 is thus tightly fixed to the case body 2. Furthermore, when the resin injected around the housing 31 having convex and concave portions solidifies, the solid resin engages with the convex and concave portions of the housing 31, thereby enfolding or sandwiching the concave and convex portions. In this manner, the case body 2 tightly retains the housing 31. This configuration allows the case body 2 to appropriately retain the connector 3 even when the case body 2 and the housing 31 are made from respective different resin materials, for example, even when the resin for the case body 2 does not adhere to the resin for the housing 31. The injection molding machine 70 performs a case formation process of forming the case body 2 integrated with the connector 3 by injecting resin into the mold 10 retaining the connector 3.

Figure 13:
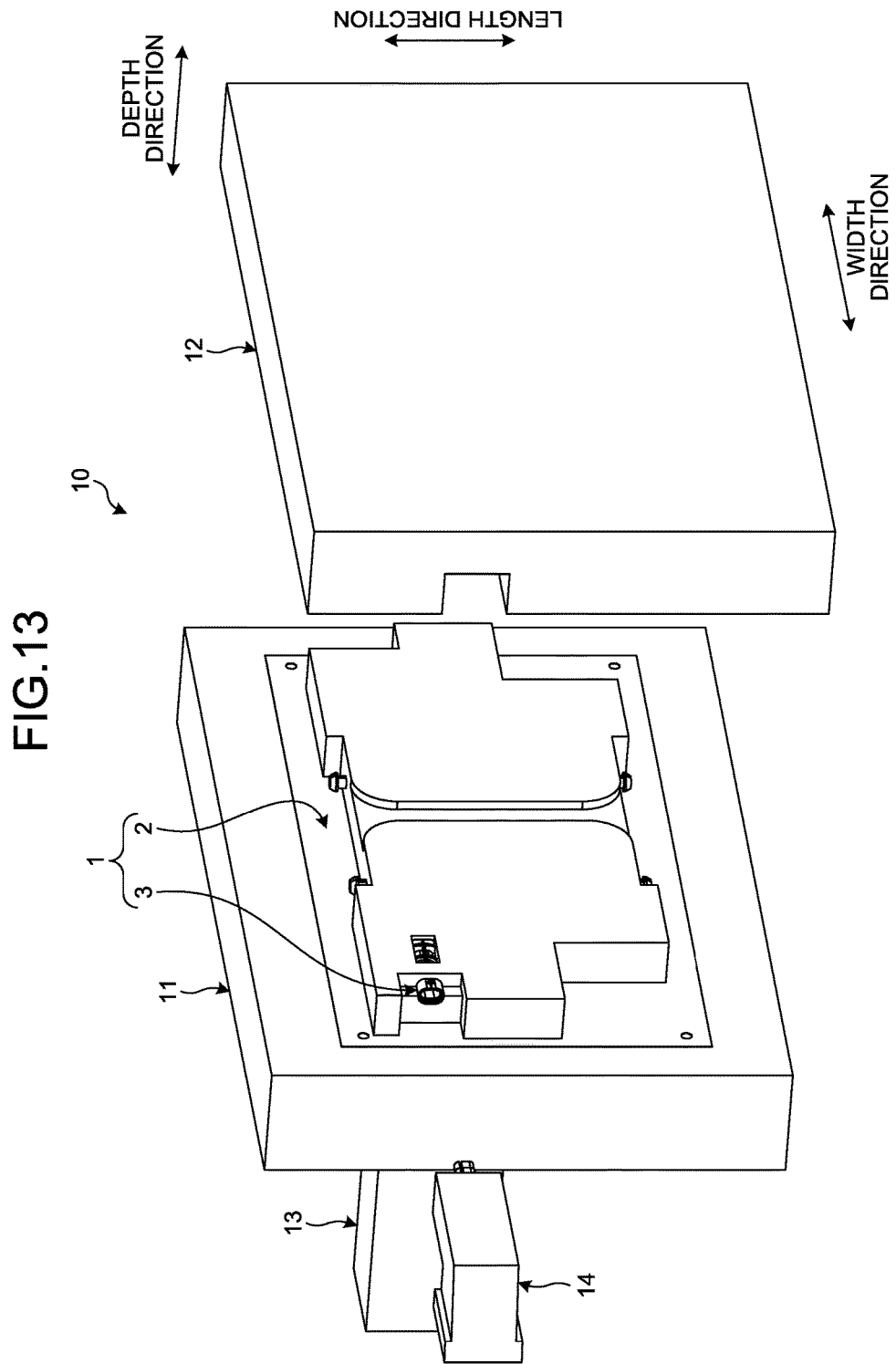
FIG. 13 is a perspective view of the mold opened after formation of the case with connector.

After solidification of the resin injected into the mold 10, the actuator of the injection molding machine 70 slides the second mold 12 and the fourth mold 14 and opens the mold 10. FIG. 13 is a perspective view of the mold opened after formation of the case with connector. The injection molding machine 70 ejects the case with connector 1 from the first mold 11 with ejector pins. The injection molding machine 70 of this embodiment ejects the first mold 11 and the third mold 13 using ejector pins. This configuration allows the injection molding machine 70 to perform the process of ejecting the case with connector 1 and the process of ejecting the third mold 13 and releasing the electrical wire accommodation portion 19 at the same time. The operator thus can start the connector retention process of setting the next connector 3 and electrical wire W in the first mold 11 without sliding the third mold 13.

Figure 14:
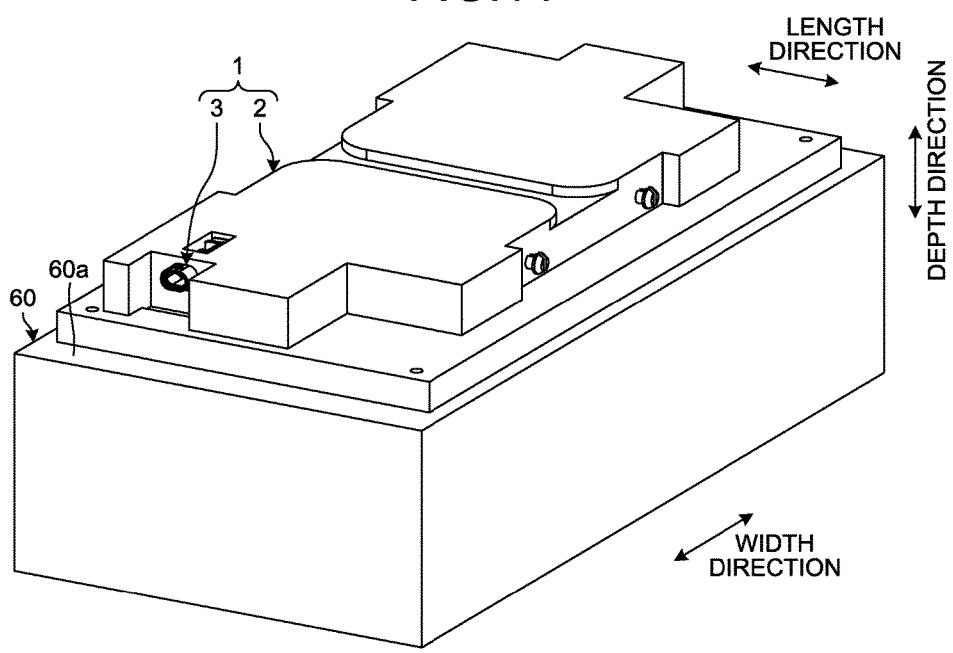
FIG. 14 is a perspective view of the case with connector used as a lid member.

The case with connector 1 according to the embodiment is used as, for example, a lid member installed to a battery body. FIG. 14 is a perspective view of the case with connector used as a lid member. The case with connector 1 is fixed to a battery body 60 in such a manner that covers an upper surface 60a of the battery body 60. The upper surface 60a is a surface having a battery post, a terminal, and others of the battery. The case with connector 1 has electronic parts such as a fuse accommodated inside thereof. The electrical wire W connected to the connector 3 is connected to, for example, a control board disposed on the battery body 60. The connector 3 is connected with an external apparatus such as a control device for controlling and monitoring the battery through a wire harness or the like.

As described above, the case with connector 1 according to the embodiment has the connector 3, the case body 2, and the electrical wire W. The case body 2 has the cylindrical side wall portion 5 and the end wall portion 6 closing one end side of the side wall portion 5 and forming the accommodation portion 4 along with the side wall portion 5. The case body 2 is formed by insert molding and has the side wall portion 5 integrated with the connector 3. The electrical wire W has an end connected to the connector 3 and the other end projecting to the accommodation portion 4.

In the case with connector 1 according to the embodiment, the case body 2 is formed by insert molding with respect to the connector 3 having the electrical wire W preliminarily connected thereto. This configuration reduces man-hours necessary for connecting the electrical wire W to the connector 3 compared with such a configuration that the electrical wire W is connected to the connector 3 after integration of the case body 2 and the connector 3. In the condition that the connector 3 and the case body 2 are integrated with each other, the wall portions 51, 52, 53, and 54 configuring the side wall portion 5 and the end wall portion 6 are likely to cause disturbance to the assembly operation. In the assembly operation of the electrical wire W, assembling the electrical wire W to a single unit connector 3 is more efficient than assembling the electrical wire W to the connector 3 integrated with the case body 2. The case with connector 1 according to the embodiment can thus exert advantageous effects in improving manufacturing efficiency. In the case with connector 1 of this embodiment, the connector 3 with the electrical wire W preliminarily connected thereto is integrated with the case body 2, which requires no interconnection harnesses for connecting the connector 3 with a substrate and thus can reduce the cost.

Figure 15:
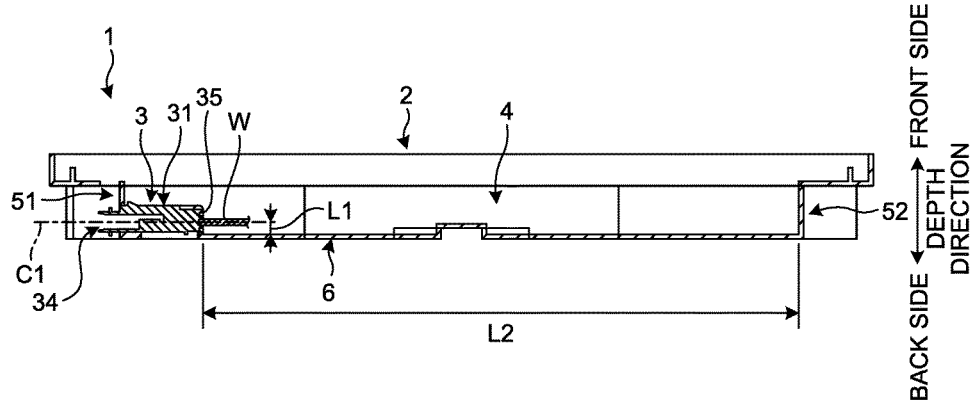
FIG. 15 is a cross-sectional view of the case with connector along a direction of a center axis of the connector.

The case with connector 1 according to the embodiment is more advantageous if assembling the electrical wire W to the connector 3 integrated with the case body 2 is more difficult. Conditions in which assembling the electrical wire W to the connector 3 is more difficult will be described with reference to FIG. 15. FIG. 15 is a cross-sectional view along the XV-XV line in FIG. 1 and a cross-sectional view of the case with connector along a direction of a center axis of the connector. In the case with connector, if the connector 3 is disposed close to the end wall portion 6, assembling the electrical wire W to the connector 3 is more difficult. In other words, in the case with connector 1, if the connector 3 is disposed such that the electrical wire W projects toward the inner portion of the accommodation portion 4 in the depth direction, assembling the electrical wire W to the connector 3 is more difficult. This problem is caused because the operator in the assembly operation has a difficulty in visually checking the inside of the connector 3 and because tools, jigs, and fingers of the operator are likely to interfere with the end wall portion 6. More specifically, a shorter distance L1 from the center axis C1 of the connector 3 to the end wall portion 6 makes assembly of the electrical wire W to the connector 3 more difficult. In addition, a shorter distance L2 from the first end surface 35 of the connector 3 to the opposite second wall portion 52 makes assembly of the electrical wire W more difficult. With a shorter distance L2, the operator has a difficulty in visually checking the inside of the connector 3, and tools, jigs, and fingers of the operator are likely to interfere with the second wall portion 52.

In the case with connector 1 of this embodiment, a distance L3 illustrated in FIG. 1, which is a distance from the center axis C1 to the third wall portion 53, is short. A shorter distance from the center axis C1 to the third wall portion 53 or the fourth wall portion 54 configuring the side wall portion 5 makes assembly of the electrical wire W to the connector 3 more difficult. A smaller accommodation portion 4, in other words, for example, a shorter distance between the third wall portion 53 and the fourth wall portion 54, makes assembly of the electrical wire W to the connector 3 more difficult. Furthermore, in the direction toward which the electrical wire W projects from the connector 3, a projecting portion such as a rib formed on an extension of the electrical wire W makes assembly of the electrical wire W to the connector 3 more difficult. In such a case that the connector 3 is disposed at a position to which the electrical wire W is difficult to be assembled, the case with connector 1 of this embodiment is more advantageous that has the case body 2 integrated with the connector 3 having the electrical wire W connected thereto by insert molding.

The connector 3 is preferably an existing or a ready-made part such as a marketed product. Use of a ready-made connector 3 can reduce the cost for evaluating the connector 3. In this case, the evaluation cost of the connector 3 can be reduced, for example, compared with the case of forming the case body 2 and the connector 3 together with a single mold and forming an original connector 3. Use of a ready-made connector 3 exerts advantageous effects in improving manufacturing efficiency and reducing the manufacturing cost.

In the case with connector 1 according to the embodiment, the electrical wire W projects to the inner portion of the accommodation portion 4 in the depth direction. The electrical wire W projects from an end on the end wall portion 6 side of the first wall portion 51 along the end wall portion 6. If the electrical wire W projects from a position near the end wall portion 6, the case with connector 1 of this embodiment is more preferable that integrates the case body 2 with the connector 3 with the electrical wire W connected thereto by insert molding.

A method of manufacturing the case with connector according to the embodiment includes the connector retention process and the case formation process. The connector retention process is a process of having the mold 10, which is provided with the hollow portion 26 with resin injected thereinto and the electrical wire accommodation portion 19 partitioned from the hollow portion 26, retain the connector 3 and of accommodating the electrical wire W connected to the connector 3 in the electrical wire accommodation portion 19. The connector 3 is retained by the mold 10 in a manner having at least a part of the connector 3 exposed to the hollow portion 26. In this embodiment, the hollow portion 26 and the electrical wire accommodation portion 19 are partitioned from each other by the partition wall 18. The case formation process is a process of forming the case body 2 by insert molding in which resin is injected into the hollow portion 26 of the mold 10. The case body 2 formed in the case formation process is integrated with the connector 3 and accommodates the electrical wire W inside (the accommodation portion 4) thereof. In this embodiment, the case body 2 and the connector 3 are integrated with each other in the case formation process. The method of manufacturing the case with connector according to the embodiment can reduce the man-hours necessary for connecting the electrical wire W to the connector 3 and can therefore improve manufacturing efficiency of the case with connector 1.

The shapes of the case body 2 and the connector 3 are not limited to the shapes illustrated as examples. For example, the planar shape of the case body 2 may be polygonal instead of rectangular. The fitting portion 34 of the connector 3 may be a male type or a female type. The electrical wire W may project from the connector 3 in another direction other than the direction of the center axis C1. In addition to these examples, the configuration of the case with connector 1 can be changed as appropriate. The connector 3 may be a waterproof connector or may be a non-waterproof connector.

A conductive member connected to the connector 3 and projecting to the accommodation portion 4 is not limited to the electrical wire W and may be a bus bar, a terminal, a lead wire, and the like. The electrical wire accommodation portion 19 is referred to as a bus bar accommodation portion, a terminal accommodation portion, or a lead wire accommodation portion depending on the kind of conductive member accommodated in the electrical wire accommodation portion 19. The electrical wire accommodation portion 19 in this embodiment is an example of a conductive member accommodation portion for accommodating a conductive member. The electrical wire accommodation portion 19 is arranged and shaped in a manner suitable for accommodating the electrical wire W. A complicated shape, such as a bent shape, of a portion projecting from the connector 3 of the conductive member does not make the shape of the mold 10 complicated, which is another advantageous effect of the case with connector 1 of this embodiment. The material and the shape of the case body 2 are not affected by the material or the shape of the conductive member, which enhances design freedom.

The case with connector 1 of this embodiment has the first end surface 35 of the connector 3 exposed from the other end surface 56b of the retaining portion 56. Instead of this configuration, the first end surface 35 may be integrated with the retaining portion 56 without being exposed from the other end surface 56b. In this case, the electrical wire W preferably passes through the retaining portion 56 and projects from the other end surface 56b to the accommodation portion 4. In the case with connector 1 in this configuration, the electrical wire W and the other end surface 56b of the retaining portion 56 are integrated with each other and form a waterproof structure for preventing inflow of water into the accommodation portion 4.

Modification of the Embodiment

Figure 16:
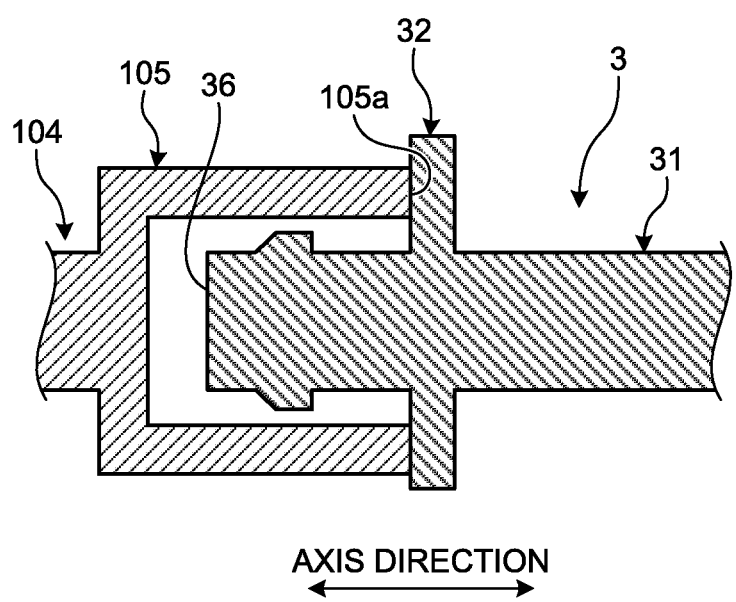
FIG. 16 is a cross-sectional view of a main portion of a connector and a fourth mold according to a modification of the embodiment.

A modification of the embodiment will now be described. FIG. 16 is a cross-sectional view of a main portion of a connector and a fourth mold according to a modification of the embodiment. The housing 31 of the connector 3 according to the modification has a flange portion 32. The flange portion 32 is formed on the second end surface 36 side. The flange portion 32 is a plate-like portion projecting outward. The flange portion 32 replaces, for example, the end retaining portions 23 and 25 of the above-described embodiment. A fourth mold 104 of the modification has a cylindrical portion 105. The cylindrical portion 105 is a cylindrical shape portion with a bottom. When a front end 105a of the cylindrical portion 105 contacts with the flange portion 32, the cylindrical portion 105 and the flange portion 32 form a closed room for accommodating an end on the second end surface 36 side of the housing 31. Because no resin enters the closed room, the fourth mold 104 allows the whole end of the housing 31 to be taken out. According to the modification, the end retaining portion 23 is unnecessary, and no through-holes 55e are formed on the case body 2.

The features described in the embodiment and the modification can be combined as appropriate and implemented.

In the case with connector and the method of manufacturing the case with connector according to the embodiment, a connector with a conductive member connected thereto is integrated with a case body by insert molding. The case with connector and the method of manufacturing the case with connector according to the embodiment exert advantageous effects in improving manufacturing efficiency.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A case with connector, comprising:
   a connector;
   a case body that includes a cylindrical side wall portion and an end wall portion closing one end side of the side wall portion and forming an accommodation portion along with the side wall portion, the case body being formed by insert molding and integrated with the connector at the side wall portion; and
   an electrical wire that has one end side connected to the connector and another end side projecting into the accommodation portion; and
   a retaining mechanism that retains the electrical wire in a state contacting with a terminal disposed inside a housing of the connector.

2. The case with connector according to claim 1, wherein
   the conductive member projects into an inner portion of the accommodation portion in a depth direction.

3. A method of manufacturing a case with connector, comprising:
   a connector retention process of causing a mold retain a connector, the mold having a hollow portion into which resin is injected and a conductive member accommodation portion partitioned from the hollow portion, and of accommodating an electrical wire that is connected to a terminal disposed inside a housing of the connector in the conductive member accommodation portion; and
   a case formation process of forming a case body by integrating the case body with the connector and accommodating the electric wire in an inside room of the case body with insert molding in which resin is injected into the mold.

* * * * *